United States Patent
Conklin et al.

(10) Patent No.: US 11,067,630 B2
(45) Date of Patent: Jul. 20, 2021

(54) SYSTEM AND METHOD FOR ELECTRONICS TIMING DELAY CALIBRATION

(71) Applicant: University of Florida Research Foundation, Incorporated, Gainesville, FL (US)

(72) Inventors: John Conklin, Newberry, FL (US); Paul C. Serra, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 430 days.

(21) Appl. No.: 16/086,092

(22) PCT Filed: Apr. 21, 2017

(86) PCT No.: PCT/US2017/028815
§ 371 (c)(1),
(2) Date: Sep. 18, 2018

(87) PCT Pub. No.: WO2017/184966
PCT Pub. Date: Oct. 26, 2017

(65) Prior Publication Data
US 2020/0292616 A1  Sep. 17, 2020

Related U.S. Application Data

(60) Provisional application No. 62/326,560, filed on Apr. 22, 2016.

(51) Int. Cl.
*G01R 31/319* (2006.01)
*G01R 31/317* (2006.01)

(52) U.S. Cl.
CPC ... *G01R 31/3191* (2013.01); *G01R 31/31727* (2013.01)

(58) Field of Classification Search
CPC ............... G01R 31/3191; G01R 31/31727
See application file for complete search history.

(56) References Cited

U.S. PATENT DOCUMENTS

| | | | |
|---|---|---|---|
| 5,910,740 A | 6/1999 | Underwood | |
| 6,657,456 B1 | 12/2003 | Jefferson et al. | |
| 6,661,860 B1 | 12/2003 | Gutnik et al. | |
| 8,816,743 B1 | 8/2014 | Lu et al. | |

(Continued)

OTHER PUBLICATIONS

International Searching Authority, International Search Report and Written Opinion for International Application No. PCT/US2017/028815, dated Jul. 10, 2017, 10 pages, United States Patent and Trademark Office, U.S.A.

*Primary Examiner* — Cynthia Britt
(74) *Attorney, Agent, or Firm* — Alston & Bird LLP

(57) ABSTRACT

A system and method for measuring or calibrating a delay through a circuit path within an integrated circuit is disclosed. In some embodiments, a delay locked loop (DLL) circuit is provided. An arbiter circuit in the DLL compares timing of a clock signal and a delayed version of the clock signal that has passed through the circuit path. The percentage of the clock signal with feature that arrives before the corresponding feature of the delayed clock can be an indication of the delay timing through the path relative to a period of the clock signal and used as feedback in the DLL.

24 Claims, 6 Drawing Sheets

(56) References Cited

U.S. PATENT DOCUMENTS

2002/0049936 A1* 4/2002 Gutnik .................. G06F 1/10
 714/700
2002/0118069 A1 8/2002 Fujiwara et al.
2008/0062039 A1 3/2008 Cohen et al.
2009/0303091 A1 12/2009 Rivior

* cited by examiner

Environmental Compensation

- Temperature, voltage, radiation, aging → chain delay variations
- Delay Locked Loop (DLL) measures delay variations Figure 5: Delay chain propagation delay as a function of control input

SYSTEM AND METHOD FOR ELECTRONICS TIMING DELAY CALIBRATION

CROSS REFERENCE TO RELATED APPLICATIONS

This application is a national stage application, filed under 35 U.S.C. § 371, of International Application No. PCT/US2017/028815, filed Apr. 21, 2017, which claims the benefit of U.S. Provisional Patent Application Ser. No. 62/326,560, filed Apr. 22, 2016, which is incorporated herein by reference in its entirety, including any figures, tables, and drawings.

FEDERALLY SPONSORED RESEARCH

This invention was made with government support under Grant Nos. NNX14AO53G and NNX16AT13A, awarded by the National Aeronautics and Space Administration (NASA). The Government has certain rights in the invention.

BACKGROUND

The present disclosure is generally related to calibration of timing delay in integrated circuits. In communication systems where delays between successive pulses may be used to transmit digital signals, it is desirable to control the timing delay of the pulse transmission in a precise and accurate fashion. Integrated circuits are miniaturized circuits that are attractive in communication systems due to their small weight, footprint and low power consumption. The timing delay of signals propagating though an integrated circuit depends on a variety of factors such as process, operating voltage, and temperature. These factors may become an issue for communication systems operating in harsh environments such as in space applications, where temperature and aging are difficult to control. To maintain precision timing over the life of the communication system, there is a need for measuring and calibrating timing delays accurately in changing environmental conditions.

SUMMARY

According to some embodiments, an integrated circuit comprising circuits configured to indicate propagation delay through a circuit path is disclosed. The circuit path comprises an input and an output. The integrated circuit comprises a variable clock. The variable clock comprises a control input and a variable clock output. The variable clock is configured to provide at the variable clock output a variable clock signal comprising a plurality of pulses with a period that varies based on a signal at the control input. The input of the circuit path is coupled to the variable clock output so as to provide a delayed clock signal at the output of the circuit path. The integrated circuit further comprises an arbiter circuit. The arbiter circuit comprises a first arbiter input coupled to the variable clock output, a second arbiter input coupled to the output of the circuit path, and an arbiter output. The arbiter is configured to selectively generate, at the arbiter output, an arbiter output signal based on relative timing between the variable clock signal and the output clock signal. The integrated circuit also comprises at least one counter coupled to at least the arbiter output. The at least one counter is configured to provide a counter output based at least in part on the arbiter output. The counter output indicates a percentage of the plurality of pulses of the variable clock signal that are ahead of corresponding pulses of the delayed clock signal.

According to some embodiments, an integrated circuit comprising circuits responsive to a clock signal comprising a plurality of pulses is disclosed. The integrated circuit is configured to indicate propagation delay through a circuit path. The circuit path comprises an input and output. The integrated circuit comprises the circuit path and an arbiter circuit. The arbiter circuit comprises a first arbiter input adapted to receive the clock signal, a second arbiter input coupled to the output of the path, and an arbiter output. The arbiter is configured to selectively generate, at the arbiter output, an arbiter output signal based on relative timing between the variable clock signal and the output clock signal. The integrated circuit further comprises at least one counter coupled to at least the arbiter output. The at least one counter is configured to provide a counter output based at least in part on the arbiter output. The counter output indicates a percentage of the plurality of pulses of the reference clock signal that are ahead of corresponding pulses of the delayed clock signal. The integrated circuit also comprises a control logic. The control logic comprises an input coupled to the output of the at least one counter and an output coupled to alter relative timing of the reference clock signal and the delayed clock signal based on the percentage.

According to some embodiments, a method of operating an integrated circuit so as to indicate delay through a circuit path is disclosed. The method comprises passing a reference clock signal through the circuit path to produce a delayed clock signal. The reference clock signal comprises a period. The method further comprises comparing timing of the delayed clock signal to timing of the reference clock signal so as to generate an indication of delay through the circuit path relative to a predetermined portion of a period of the reference clock signal and adjusting at least one of the period of the reference clock signal or the delay through the circuit path so that the generated indication indicates a delay of the predetermined portion of the period.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
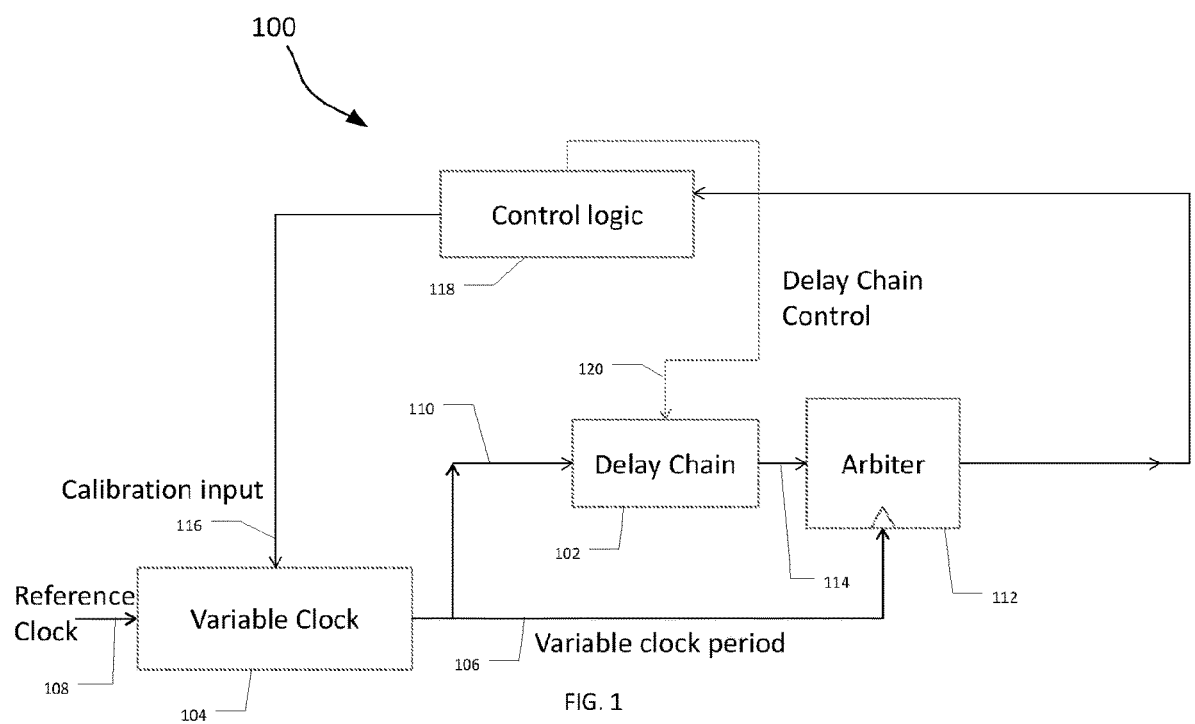
FIG. 1 is a block diagram of an exemplary Delay Locked Loop (DLL) used for measuring signal delays in a delay chain according to some embodiments.

The inventors have recognized and appreciated that a relatively small amount of circuitry incorporated into an integrated circuit may increase the accuracy and functionality of the integrated circuit. The circuitry may indicate a delay through a circuit path within the integrated circuit. This indication may be output or used internally to the integrated circuit, providing a mechanism to interpret or calibrate results of time dependent operations of the integrated circuit. As a result, the integrated circuit may be used in environments subject to variation that might otherwise interfere with accurate operation of the integrated circuit. Environmental variations may include variations in temperature or radiation within the environment in which the integrated circuit operates voltage or current applied to power the integrated circuit, or even aging of the integrated circuit, which can change operating characteristics of the integrated circuit.

In some embodiments, the circuitry to indicate a delay through a circuit path within the integrated circuit may operate based on a clock signal with a clock period that may be varied based on a control input at the clock. An arbiter circuit may compare timing of the clock and a delayed version of the clock signal that has passed through the circuit path. The arbiter may provide an output, indicating whether a feature of the variable clock signal occurs before or after a corresponding feature of the delayed clock. As the clock is periodic, the corresponding features will recur multiple times over a measurement interval. The percentage of those features of the clock that occur before the corresponding feature of the delayed clock can be an indication of the delay through the path relative to a period of the clock signal.

In some embodiments, a relative percentage of 50% may be an indication that the delayed clock is delayed relative to the clock by a period of the clock. This percentage may result from random variations in operation of the circuitry. When the corresponding features occur, nominally, at the same time, neither should be before the other. However, the output of the arbiter will depend on which feature is registered first by the arbiter, which in turn depends on random factors. For electronic noise that has a Gaussian distribution, randomness leads to the arbiter recognizing each signal to occur first about half the time.

This operation provides a mechanism to determine whether the delay of the circuit path equals a predetermined portion of a period of the clock signal. When the delay through the circuit path makes corresponding features of the clock and the delayed clock coincident, that delay equals the portion of the period of the clock that separates a first feature of the clock and a second feature of the clock that, once delayed, becomes the corresponding feature of the delayed clock. Thus, identifying the period of the clock that leads to coincidence provides an indication of the delay.

In some embodiments, the first feature may be a pulse of a periodic clock signal. The second feature may be a preceding pulse. In that case, the predetermined portion of the period may be one period or, in some embodiments, an integer number of periods. It should be appreciated that any repeating feature to which the arbiter circuit responds may be used, and those features need not be the same in the clock and the delayed clock. The first feature, for example, may be a rising edge of the pulse of a periodic clock signal, and the second feature, for example, may be a preceding falling edge of a pulse. For a clock with a 50% duty cycle, the predetermined portion of the period may be one-half period or, in some embodiments, one half plus an integer number of periods.

The arbiter circuit may be implemented in any suitable way. In some embodiments, the arbiter circuit may be a state machine, such that its state, and therefore its output, is dependent on the order in which features are detected. As a specific example, the arbiter circuit may be a flip-flop with each of the clock signal and the delayed clock signal being supplied at a signal and/or clock input. As a specific example, the flip-flop may be a D flip-flop with one of the signals used to clock the flip-flop and the other applied to the signal input. However, other circuit configurations may be used, including, in some embodiments, an S-R flip-flop.

The output of the arbiter circuit may be converted into an indication of relative delay in any suitable way. In some embodiments, at least one counter may be used to provide at least one counter output. A counter, for example may count a number of times, over some measurement interval, that the arbiter circuit produces an output indicative of a feature in the clock signal occurring before a corresponding feature in the delayed clock signal. A count representative of 50% of the features in the clock signals indicates that the corresponding features are coincident. A count below 50% may indicate that the corresponding feature of the delayed clock is occurring after and conversely, a count greater than 50% may indicate the opposite order. However, any count that can be arithmetically manipulated to yield information about relative order may alternatively or additionally be used.

For example, in embodiments in which the clock has a fixed period such that the number of instances of the feature of the reference signal over a measurement interval is known, a single count may provide sufficient information, as a count representing 50% of the features in the clock may be determined in advance. Moreover, it should be appreciated that the count need not be precisely 50%, but may instead be within some threshold amount of 50% to deem the features of the references clock and corresponding features of the delayed clock to be coincident.

In other embodiments, the period of the clock may be variable. In that scenario, multiple counters may be used. A first counter may count, during a measurement interval, occurrences of the feature in the clock and a second counter may count instances in which those features occur in time prior to corresponding features of the delayed clock. An indication of coincidence may be determined when the first counter has twice the number of counts as the second counter over the measurement interval. It should be appreciated that the ratio between the first counter and the second counter need not be precisely 2 times, but may instead be within some threshold amount of 2 times to deem the features of the references clock and corresponding features of the delayed clock to be coincident.

Regardless of the manner in which coincidence is detected, feedback may be used to achieve that coincidence. In some embodiments, the feedback may be used to alter the period of the clock signal. In such a scenario, the period of the clock, once coincidence is detected, represents delay through the circuit path. Such an indication of delay may be used in any suitable way, such as selecting a signal that has an appropriate amount of delay or mathematically adjusting a measurement made with circuitry in the path. Alternatively or additionally, the feedback may be used to alter the delay in the circuit path. Accordingly, an integrated circuit as described herein may provide more accurate operation or results.

According to some embodiments, a Delay Locked Loop (DLL) to measure internal propagation delays in circuits with both picseconds accuracy and large range is disclosed in detail below in connection with FIGS. 1-2. The DLL matches a variable reference clock period with the internal delay in order to measure the internal delay accurately.

FIG. 1 is a block diagram of an exemplary Delay Locked Loop (DLL) 100 used for measuring signal delays in a delay chain according to an embodiment.

Two example implementations of the delay chain 102 in FIG. 1 are discussed herein. The first design may use the delay variation within a cell of an FPGA, which depends on the input value. Because the path of the signal pulses does not change with different delay settings, routing variations on the FPGA have less impact on static errors and nonlinearities. The least significant bit (LSB) in the delay chain setting is typically equal to a 10 ps increase in the delay, and is consistent cell to cell. However, repeated routing of the signal through the local routing matrix results in large overall delays. The fixed delay is more than 60 ns for approximatively 2 ns of variable delay. The jitter also increases from 3.5 ps without the delay chain to 65 ps for a chain of 768 cells, the length required to cover more than one period of the counter.

Figure 5:
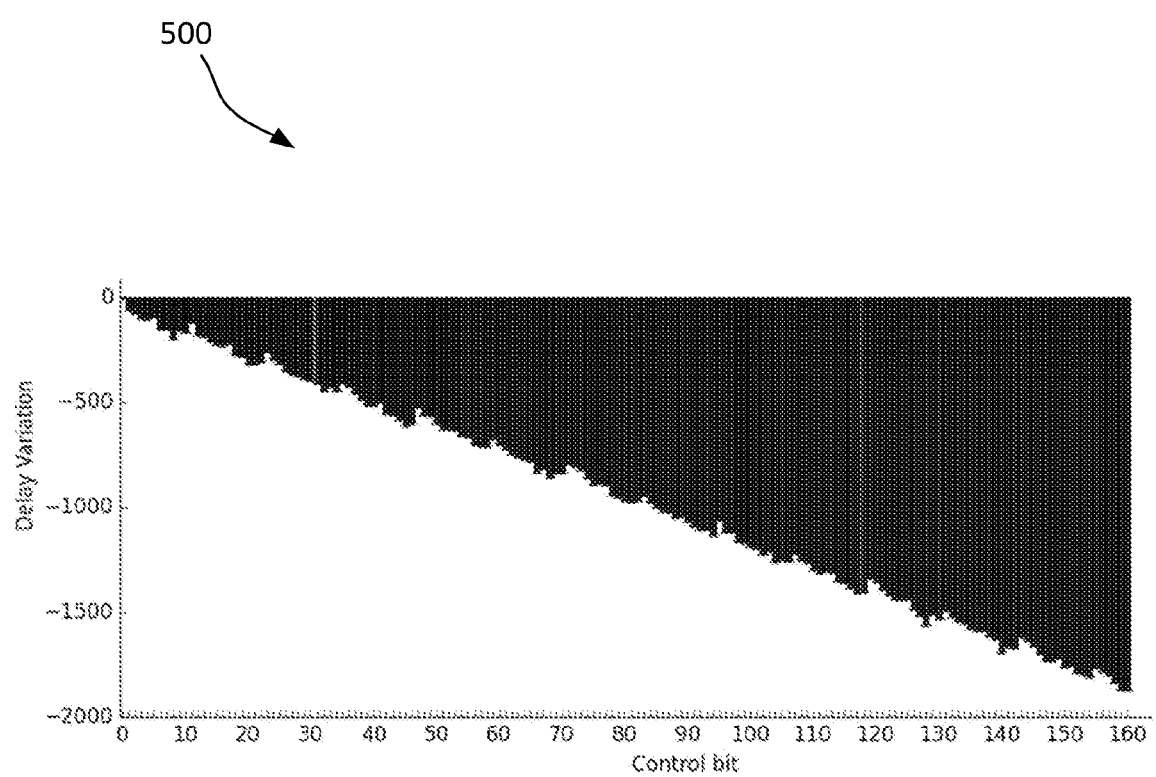
FIG. 5 is a data plot showing the delay chain propagation delay variations for the first 160 calibration input settings according to an example measurement.

A second design may use the carry chain and the clock network specific to the SmartFusion2 FPGA. The specific clock network is running along every cell in a row, and is propagating in the same direction as the carry chain. Different delays can be generated by selecting which cell the pulse travels through to jump from the fast row clock lane to the slightly slower carry chain. FIG. 5 is a data plot 500 showing the delay chain propagation delay variations for the first 160 control settings. The settings can be applied, for example, via a calibration input to the delay chain. The delay chain is much faster with an overall delay of 12 ns for a variation of 6 ns. The output jitter is the same as the base jitter, which is 3.5 ps. The typical LSB is 12 ps, however the delay increases were not monotonous and the nonlinearities more pronounced as is evident by the repeating deviations from a continuously decreasing slope in FIG. 5. Since two delay chains are used, it is possible to balance the nonlinearities of one chain with the other.

The DLL 100 shown in FIG. 1 includes a variable clock 104 that generates a variable clock period 106 based on a precise reference clock signal 108. The variable clock signal 108 is fed to a circuit path 110 comprising a delay chain 102 and then compared to itself at an arbiter 112. The rising edge of the delayed 114 and non-delayed, direct clocked signal will coincide if the delay is equal to one clock period, or a multiple of that period. As used herein, the term "period" of a periodic signal means an average period between subsequent features of the periodic signal. For example, a period is an average timing difference between adjacent pulse edges in a periodic signal with noise or jitter related fluctuations to the timing substantially averaged out.

The DLL 100 can be maintained locked using a feedback from the output of the arbiter 112 to a control input 116 to the variable clock via a control logic 118 in order to adjust the variable clock period or frequency to keep the rising edges of both signals aligned. For example, the control logic 118 may make set a starting value for the variable clock period based on an initial guess. If there is indication from the arbiter 112 that the initial clock period is different from the delay, e.g., the variable clock period is smaller than the delay, the control logic 118 may selectively increase the variable clock period until the deviation between the variable clock period and the delay is measured to be in a transition region. In some embodiments, the deviation between the variable clock period and the delay may be calculated based on the statistical percentage of features in the variable clock signal arrive at the arbiter before the corresponding features in the delayed signal within a set measurement period. For example, the arbiter circuit 112 may indicate a coincidence between the clock signal and the delayed clock signal when substantially 50% of the features in the variable clock signal arrive before the corresponding features in the delayed signal within a set measurement period. The percentage deviation from 50% may be used to calculate the deviation between the variable clock period and the delay. After reaching the transition region, the control logic 118 may further fine tune the variable clock period in small steps in order for the variable clock period and delay to coincide based on the indication from the arbiter.

The locked DLL 100 provides an indication or measurement of the delayed timing during a given sampling period in the delay chain 102 between the delay chain input and signals appearing at the delay chain output after propagating through the delay chain circuit 110. In some embodiments, the measured delay may deviate from a desired value due to, for example, environmental condition changes that impact the circuit characteristics. The control logic 118 may separately or additionally output a control signal 120 to a delay chain calibration input that adjusts the delay by, for example, adjusting a control voltage to the delay chain, such that the adjusted delay matches a desired value.

In some embodiments, the variable clock period may be generated using one or several Phase-Locked-Loops (PLLs) connected in series. FIG. 2 is a block diagram of an illustrative implementation of the DLL 200 according to some embodiments. In FIG. 2, two PLLs 204a, 204b with separate control setting inputs are connected in series to sample a reference clock signal 206. By repeatedly reprogramming the PLLs 204a, 204b and choosing suitable combinations of settings, one may generate a large set of different clock periods. This enables the complete DLL circuit including the variable clock source based on serially connected PLLs, the arbiter circuit, the feedback path and the control logic to be embedded in a single component that also houses the delay chain. That component would be capable of self-calibrating internal delays. In one example, the complete circuit may be implemented on a field programmable gate array (FPGA) device.

According to some embodiments, implementing the DLL and its control circuit on a FPGA may allow the ability to dynamically reprogram the hardware phased-locked loop of the device. Several considerations may be taken in to account when selecting the FPGA. The considerations include the presence of phased locked loops, the ability to quickly reprogram the FPGA and easily route their output. In addition, other factors such as the complete system complexity, the power consumption, the radiation tolerance and the existence of a hardened variant of the device may be taken into account depending on the harshness of the application environment.

Implementing delay timing calibration using digital signals with integrated circuit components on a FPGA may lead to performance improvement in applications such as a Time-to-Digital or Digital-to-Time converter circuit. The accuracy of these circuits may traditionally be limited by their fabrication process and temperature/voltage variations in the operating environment. By embedding the delay timing calibration circuit including DLL with PPL variable clock circuits according to some embodiments into a Time-to-Digital or Digital-to-Time converter, one may be able to perform timing calibration without requiring external calibration instruments, which allows mass-production of more accurate ICs with reduced manufacturing cost. The integrated timing calibration approach allows tracking and measurement of delay variations and calibration of circuit timing under changing temperature/voltage conditions in order to maintain consistent circuit performance in harsh environments.

In some embodiments, the delay timing calibration circuit may be part of a communication system incorporated in a spacecraft operating on orbit. For example, the delay timing may be used to control transmission of consecutive pulses in a free-space optical communication system. Integrating the timing calibration circuit on the same FPGA as the delay chain circuit may be desirable in such space applications due to the low power and small size and weight of an integrated solution.

Figure 2:
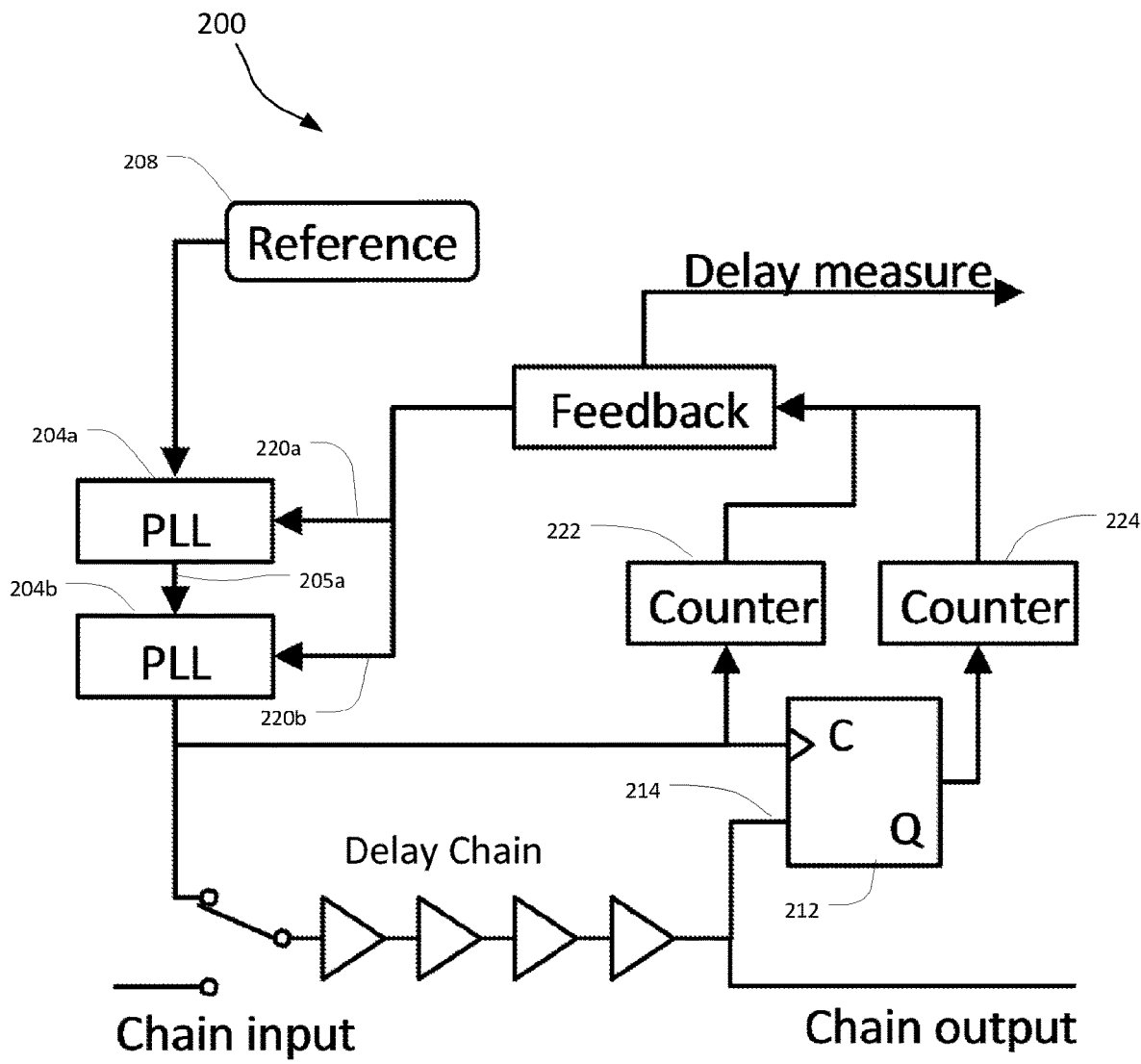
FIG. 2 is a block diagram of an exemplary implementation of the DLL according to some embodiments.

In the example embodiment in FIG. 2, two PLLs 204a, 204b are used to generate a variable frequency in order to implement the variable clock. The PLLs 204b, 204b use frequency multipliers or dividers to sample a reference clock with a fixed reference period, and the frequency can be varied by reprogramming the PLL registers via the control setting inputs 220a, 220b to each of the PLLs. For example, each one of the PLLs may be a fractional-N PLL and the first one of the PLLs 204a coupled to a reference clock 208 with fixed clock frequency fref to provide at the PLL output 205a a first synthesized frequency (N+m/n)·fref, where N, m and n are integers programmed at the first PLL's register by its control setting input 220a. The second PLL 204b may modulate the output frequency of the first PLL with a second multiplier (N'+m'/n') where N', m' and n' are a second set of integers programmed at the second PLL's register by its control setting input 220b. Any suitable combination of sets of integers in the multipliers may be employed to control the PLLs such that when different multipliers from a serial array of several PLLs are sequentially applied, a variable clock signal with an desired timing period resolution much smaller than the fixed reference clock period may be achieved.

Because the variable frequency is a multiple of a known reference clock, the delay can be measured with an accuracy comparable to the stability of that reference clock. In some embodiments, a chip-scale atomic clock (CSAC) may be used as the reference clock to provide a high stability. In one non-limiting example, using a SmartFusion2 FPGA, with two Phase Locked Loops, and a 10 MHz CSAC as the reference clock, a variable frequency generator with a typical period resolution of 1 ps is demonstrated, with a worst-case resolution of 1.4 ps, over a variable clock period range of Tmin=4 ns to Tmax=24 ns. It should be appreciated that any suitable reference clock source may be used to generate a frequency basis for the PLLs. For example the reference clock may be a crystal oscillator. The crystal oscillator may be provided externally or may reside on the same component that houses the DLL circuit. Although PLLs are disclosed to implement the variable clock, it should also be readily appreciated that any variable frequency source may be used as a variable clock. For example, the variable clock may be any Voltage Controlled Oscillator that is external or integrated on the same chip with the DLL circuit in order to save footprint, weight and/or cost.

The arbiter determines whether the delayed signal or the non-delayed direct signal arrives first. In some embodiments, the clock signals are periodic digital pulses and the arbiter is a rising edge arbiter. A clocked latch 212, present in all FPGA tiles, can determine if one signal arrives before another, by sampling one while using the other as a clock. In the Delay Locked Loop example in FIG. 2, the delayed clock signal 214 is sampled using the direct signal as a clock in a latch. In one non-limiting example, the arbiter circuit may be a D-flip flop with the direct, non-delayed clock signal used to clock the flip-flop and the delayed clock signal applied to the signal input. For a given delay period, one may use a first counter 224 to count the number of ones, which occurs when the delayed clock rising edge arrives before the non-delayed clock rising edge from the variable clock, and divide this number by the total number of rising edges counted by a second counter 222 coupled directly to the non-delayed clock signal. The delay period may be adjusted until this fraction equals 50%, which occurs when the delay period is equal to one cycle of the non-delayed clock frequency.

Figure 3:
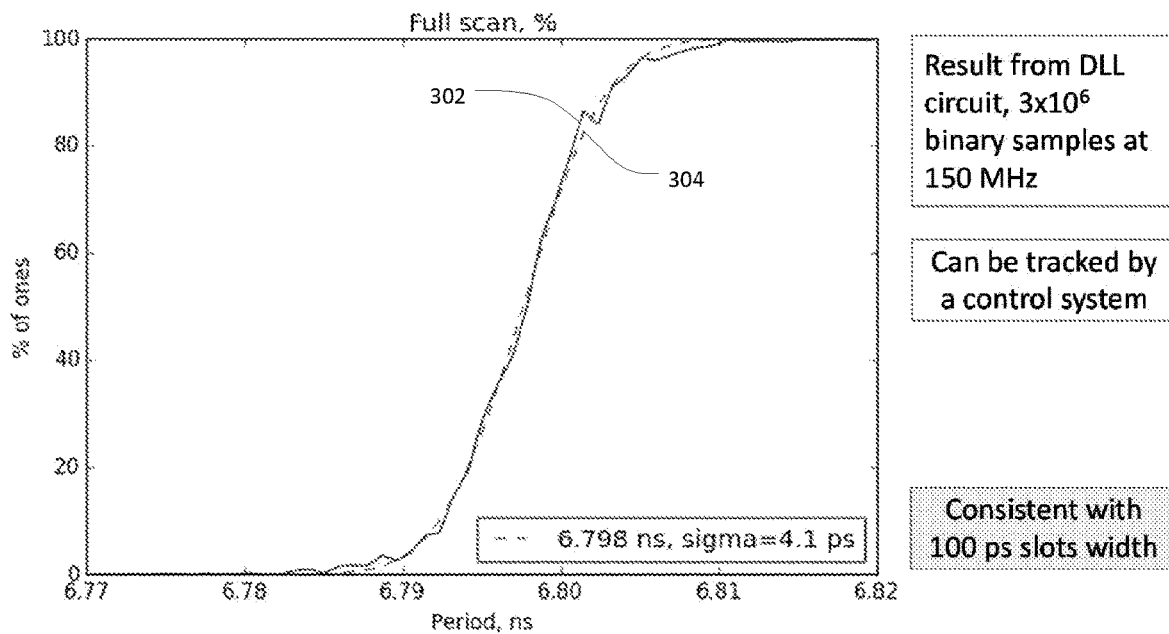
FIG. 3 is a data plot showing the fractional percentage of "1"s from the first counter in the exemplary DLL circuit in FIG. 2 as a function of delay periods according to an example measurement.

FIG. 3 shows a plot 300 of the fractional percentage of "1"s from the first counter 224 in the DLL circuit 200 in FIG. 2, over a range of delay periods from the variable clock near the transition region, according to an example measurement.

The data in FIG. 3 shows that the transition 302 can be modeled as a cumulative Gaussian distribution 304. The standard deviation of that distribution can be interpreted as an error, due to the clock cycle-to-cycle jitter and the latch meta-stability. The clock signals in the FPGA fabric in this example have a precision below 3.5 ps at room temperature. The measurement can be repeated at the same rate as the clock, between 40 MHz and 200 MHz which allows the DLL to measure delays with a precision well below the jitter level, down to hundreds of femtoseconds.

In some embodiments, the DLL arbiter measures the chain output against a clock rising edge. Because clock signals are periodic, if the DLL is locked with a period T, then it will also lock with any period Tn=T/n, as the rising edges will still coincide. This allows the DLL delay measurement range to be extended to longer delays. Measurements of delays up to 80 ns, with the mode n=5 have been demonstrated. However, while the range of the DLL is multiplied by n for a given "harmonic", the effective resolution of the frequency generator for the variable clock at that mode is divided by n, reducing the measurement capabilities.

The existence of several modes creates the need to distinguish between modes. If two periods, for two successive modes can be sampled, then the mode number can extracted using Eq. (1):

$$n = \frac{T_{n+1}}{T_n - T_{n+1}}. \tag{1}$$

In order to sample at least one mode, the maximum period from the variable frequency source must be at least twice the minimum. The source must cover [Tmin, Tmax] with Tmax>2 Tmin. To be able to sample two modes, and extract the mode number n, Tmax should be as least Tmax>3Tmin.

Delays can both be measured in real time, while the modulator is operating to cancel environmental variation, or be used for static calibration. In the first case, the delay locked-loop sends signals through the chain when the chain is not used for data modulation, or through a parallel chain close to the one used for modulation. By repeatedly sampling the minimum and the maximum of the chain, the effect of both temperature and voltage can be cancelled using an affine function on the delay chain setting. When used to perform static calibration, the DLL measures all delay chain settings, one by one. The result of that operation allows us to generate a table that will reduce integral nonlinearities of the delay chain close to 1 or 2 setting LSB, and ensure that the delay variation is monotonous. In some embodiments when the timing delay circuit is used in free-space communications, this operation can be performed on-orbit in the spacecraft, within the FPGA.

Figure 4:
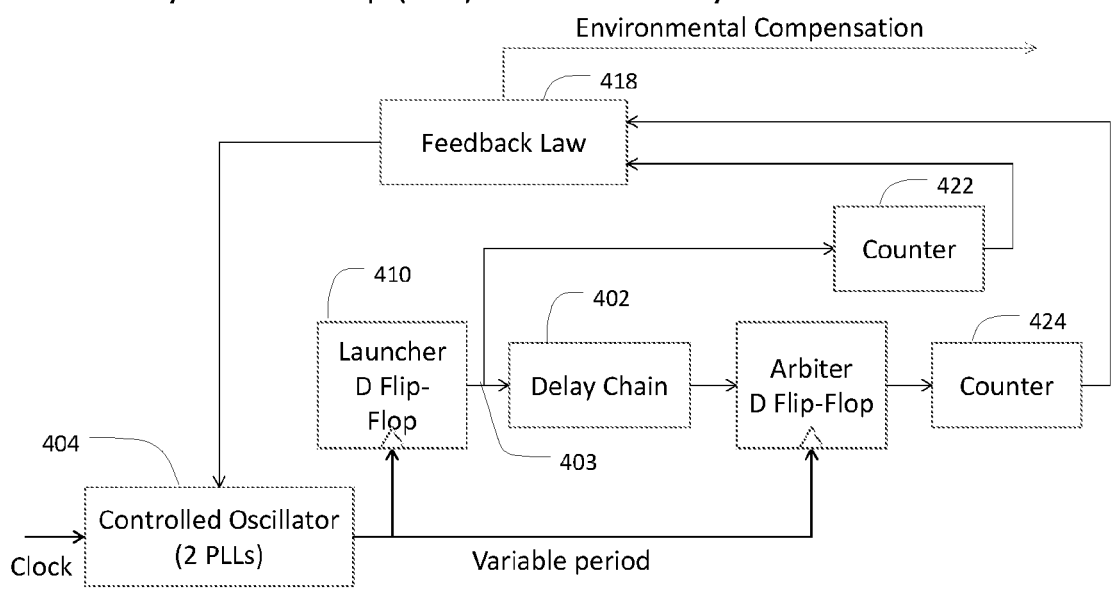
FIG. 4 is a block diagram of an exemplary embodiment of the DLL design.

FIG. 4 is a block diagram showing another illustrative embodiment 400 of the DLL design. In FIG. 4, a launcher 410 is provided to couple the output of the variable clock (Controlled Oscillator) 404 with the input 403 of the delay chain 402, in order to synchronize launching of the periodic clock signal to propagate through the delay chain at the same timing as the rising edges of the variable period clock signal. In some embodiments, the launcher 410 may be implemented as a D Flip Flop clocked by the variable period clock.

In the example embodiment in FIG. 4, the output of the two counters 422, 424 indicate a measurement of the relative deviation of the timing delay after the delay chain 402 from the non-delayed clock signal and the measured delay variations are used by the feedback law 418 or a control logic to provide environmental compensation to the underlying circuit. For example, the control logic may adjust the voltage settings on the calibration input to the delay chain circuit, and/or tuning the temperature of the circuit housing by employing heating or cooling elements in order to affect the characteristics of the circuit elements on the component such that the measured delay timing is kept at a desired level.

Figure 6:
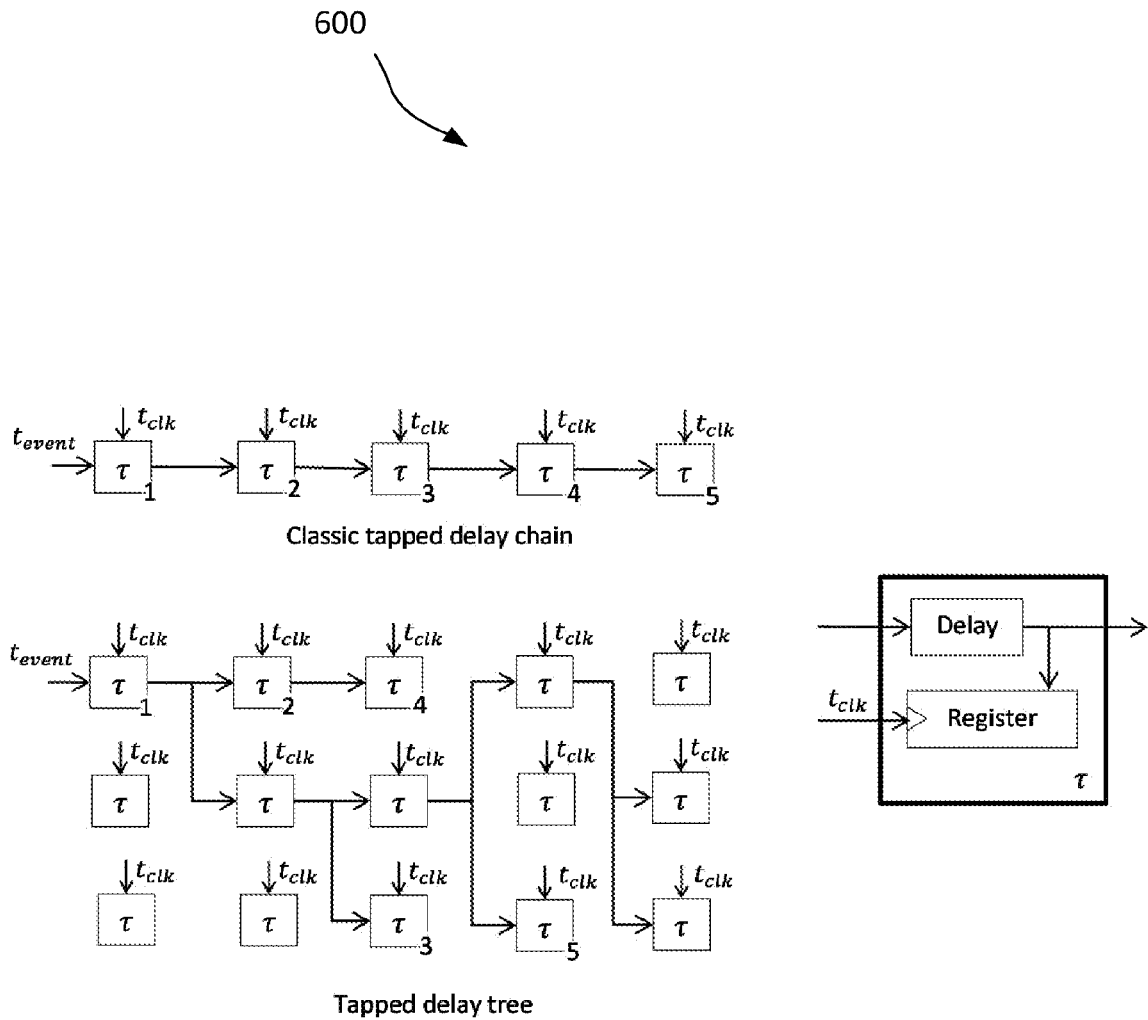
FIG. 6 is block diagram of an exemplary PLL setting process.

Referring now to the block diagram in FIG. 6, a discussion of the PLL setting selection process for each one of the at least one PLL in the variable clock in the example implementation in FIG. 2 is provided herein in connection with the illustrative diagram 600 in FIG. 6.

I. Table Construction:

The construction of the PLLs settings table may be based on an exhaustive enumeration of all PLL multiplier with the following constraints to make the iteration practical:

I. 1. Settings for all parameters;

I. 2. Frequency low and high limit at the outputs of each PLL. The low limit is set by acceptable clock noise, for low frequency, the high limit is set by the FPGA/ASIC maximum;

I. 3. Frequency low limit at the PLL phase detector. This limit will directly impact the settling time and the "re-programming" performance of the PLL. Preferably, this limit is set to be conservative than the device manufacturer specification.

Once a table is built, it is sorted by output frequency. Table entries are selected to get a nominal period step size while minimizing the gap between two entries.

II. Extension by Alias Effect

Since the PLLs settings and corresponding period are obtained with the closest possible integer fraction, the gap between two successive entries is variable. When the table grew more toward low frequencies, the maximum gap increases, reducing the quality of the table. It is possible however to use a frequency aliasing effect to extend the table. If the objective is to have the circuit to lock at frequency F, it will also lock at any multiple of F. This effect can and have been used to both reduce the maximum PLLs settings gap and divide the size of the PLLs settings table by 4.

III. Timing-Tree Time-to-Digital Converter (TDC)

New TDC topologies are possible with the ability to calibrate large amounts of delays. One possibility is a tree-time TDC, where the tapped delay chain is replaced with a tree of delays.

By selecting an optimized path among delay element in a matrix of delay and register, a more homogeneous and finer scale of delays can be created. Without a large range, high precision, embedded calibration circuit, this topology is not practical since large quantities of measurements are required to find paths.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

The above-described embodiments of the present invention can be implemented in any of numerous ways. For example, the DLL may be used as an Analog to Digital converter, which can be built using a Time-to-Digital converter architecture. In general, the standard operating voltage of electronics is decreasing from generation to generation to reduce power. For analog circuits, the noise is not reducing such that the signal-to-noise ratio is increasing from generation to generation. The solution may be to use digital electronics that now use less power and scale well to improve analog functions. The combination of DLL with PLLs allow full calibration with a completely integrated solution.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An integrated circuit comprising circuits configured to indicate propagation delay through a circuit path, the circuit path comprising a path input and a path output, the integrated circuit comprising:
    a variable clock comprising a control input and a variable clock output, wherein the variable clock is configured to provide at the variable clock output a variable clock signal comprising a plurality of pulses with a period that varies based on a signal at the control input, wherein the path input is coupled to the variable clock output and a delayed clock signal is provided at the path output;
    an arbiter circuit comprising:
        a first arbiter input coupled to the variable clock output,
        a second arbiter input coupled to the path output, and
        an arbiter output, wherein the arbiter is configured to selectively generate, at the arbiter output, an arbiter output signal based on relative timing between the variable clock signal and the delayed clock signal;
    at least one counter coupled to at least the arbiter output, wherein the at least one counter is configured to provide at a counter output a counter output signal, based at least in part on the arbiter output signal, the counter output signal indicating a percentage of the plurality of pulses of the variable clock signal that are ahead of corresponding pulses of the delayed clock signal.

2. The integrated circuit of claim 1, wherein:
the arbiter circuit comprises a flip-flop, the flip-flop comprising:
    a signal input, the signal input comprising the second arbiter input;
    a signal output, the signal output comprising the arbiter output; and
    a clock input, comprising the first arbiter input, the clock input being coupled to the variable clock output such that the flip-flop outputs a pulse at the signal output based on relative timing of a pulse of the variable clock signal and a pulse of the delayed clock signal.

3. The integrated circuit of claim 2, wherein:
the at least one counter comprises:
    a first counter comprising an input coupled to the signal output of the flip-flop such that the first counter is configured to generate a first count indicative of a number of pulses output by the flip-flop; and
    a second counter comprising an input coupled to the variable clock output such that the second counter is configured to generate a second count indicative of a number of pulses of the variable clock signal.

4. The integrated circuit of claim 1, wherein:
the integrated circuit comprises the circuit path.

5. The integrated circuit of claim 1, wherein:
the integrated circuit is in combination with a reference clock comprising a reference clock output; and
the variable clock comprises:
    at least one phase locked loop (PLL) connected in series, wherein each one of the at least one PLL comprises a PLL setting input, a PLL reference input and a PLL output, wherein:
        a PLL reference input for a first of the at least one PLL is coupled to the reference clock output; and
        a PLL output for a last of the at least one PLL is coupled to the variable clock output; and
        for each of the at least one PLL connected in series, other than the first of the at least one PLL, the PLL reference input is coupled to the PLL output of a preceding PLL in the series.

6. The integrated circuit of claim 5, wherein the reference clock is integral with the integrated circuit.

7. The integrated circuit of claim 5, wherein the reference clock is a chip scale atomic clock.

8. The integrated circuit of claim 5, in combination with:
a feedback path, wherein the feedback path is configured to control the PLL setting input of each one of the at least one PLL based on the counter output signal indicating the percentage.

9. The integrated circuit of claim 5, in combination with:
a feedback path, wherein the feedback path is configured to control a delay through the circuit path based on the counter output signal indicating the percentage.

10. The integrated circuit of claim 1, wherein:
the arbiter circuit is a rising edge circuit; and
the arbiter circuit is configured to generate the arbiter output signal with a logic "1" when a rising edge of the delayed clock signal arrives at the second arbiter input before a rising edge of the variable clock signal arrives at the first arbiter input so as to selectively generate, at the arbiter output, the arbiter output signal.

11. The integrated circuit of claim 10, wherein:
the at least one counter comprises a first counter configured to count a number of rising edges in the variable clock signal during a calibration period.

12. The integrated circuit of claim 11, wherein:
the at least one counter comprises a second counter configured to count a number of logic "1" in the arbiter output signal during the calibration period.

13. The integrated circuit of claim 1, further comprising a launcher circuit coupled to the path input and the variable clock output, wherein the launcher circuit is configured to provide an input clock signal at the path input of the circuit path based on the variable clock signal at the variable clock output.

14. The integrated circuit of claim 1, wherein the circuit path is a delay chain.

15. The integrated circuit of claim 1, further comprising a field-programmable logic array (FPGA), wherein the circuit path, the variable clock, the arbiter circuit and the at least one counter are implemented on the FPGA.

16. The integrated circuit of claim 15, wherein the FPGA is part of a communication instrument in a spacecraft.

17. The integrated circuit of claim 1, in combination with a control logic, wherein the control logic comprises:
a logic input coupled to the counter output; and
a logic output coupled to the control input of the variable clock, wherein the control logic is configured to generate at the logic output the signal at the control input of the variable clock that changes the period of the variable clock signal based on the percentage indicated by the counter output signal.

18. The integrated circuit of claim 17, wherein the control logic is configured to adjust the period of the variable clock signal so as to make the percentage 50 percent.

19. The integrated circuit of claim 1, in combination with a control logic, wherein:
the circuit path comprises a calibration input such that a delay through the circuit path varies based on a signal at the calibration input;
the control logic comprises:
a logic input coupled to the counter output; and
a logic output coupled to the calibration input of the circuit path, wherein the control logic is configured to generate at the logic output the signal at the calibration input of the circuit path that changes the delay in the path based on the percentage.

20. The integrated circuit of claim 19, wherein the control logic is configured to adjust the delay of the circuit path so as the make the percentage 50 percent.

21. An integrated circuit comprising circuits responsive to a clock signal comprising a plurality of pulses, wherein the integrated circuit is configured to indicate propagation delay through a circuit path, the circuit path comprising a path input and a path output, the integrated circuit comprising:
the circuit path;
an arbiter circuit, comprising:
a first arbiter input adapted to receive the clock signal,
a second arbiter input coupled to the path output, and
an arbiter output, wherein the arbiter is configured to selectively generate, at the arbiter output, an arbiter output signal based on relative timing between the clock signal and a delayed clock signal at the path output;
at least one counter coupled to at least the arbiter output, wherein the at least one counter is configured to provide at a counter output a counter output signal, based at least in part on the arbiter output signal, the counter output signal indicating a percentage of the plurality of pulses of the clock signal that are ahead of corresponding pulses of the delayed clock signal; and
a control logic comprising:
a logic input coupled to the counter output; and
a logic output configured to alter relative timing of the clock signal and the delayed clock signal based on the percentage.

22. A method of operating an integrated circuit so as to indicate delay through a circuit path, the method comprising:
passing a reference clock signal through the circuit path to produce a delayed clock signal, wherein the reference clock signal comprises a period;
comparing timing of the delayed clock signal to timing of the reference clock signal so as to generate an indication of delay through the circuit path relative to a predetermined portion of the period of the reference clock signal; and
adjusting at least one of the period of the reference clock signal or a delay through the circuit path so that the generated indication indicates a delay of the predetermined portion of the period.

23. The method of claim 22, wherein:
the reference clock signal is generated by a variable clock circuit comprising at least one programmable memory location; and
adjusting at least one of the period of the reference clock signal or the delay comprises adjusting the period of the reference clock by setting a value in a programmable memory location of the at least one programmable memory location.

24. The method of claim 23, further comprising:
reading at least one value in the at least one programmable memory location; and
generating a delay value indicating the delay through the circuit path based on the at least one value read from the at least one programmable memory location.

* * * * *